United States Patent [19]

Jones et al.

[11] Patent Number: 5,111,382
[45] Date of Patent: May 5, 1992

[54] HIGH POWER, HIGH FREQUENCY RESONANT INVERTER USING MOS CONTROLLED THYRISTORS

[75] Inventors: Franklin B. Jones, Catonsville, Md.; Ray S. Kemerer, Monroeville, Pa.; Charles E. Carter, Baltimore; Charles S. Kerfoot, Pasadena, both of Md.

[73] Assignee: Westinghouse Electric Corp., Pittsburgh, Pa.

[21] Appl. No.: 601,556

[22] Filed: Oct. 23, 1990

[51] Int. Cl.⁵ .................................. H02M 7/523
[52] U.S. Cl. .................................. 363/132; 363/98; 336/232; 336/233
[58] Field of Search .............. 363/58, 95, 96, 98, 363/132, 136; 336/232, 233, 200

[56] References Cited

U.S. PATENT DOCUMENTS

| | | | |
|---|---|---|---|
| 3,519,915 | 7/1970 | Kelley | 363/132 |
| 4,538,132 | 8/1985 | Hiyama et al. | 336/232 X |
| 4,875,150 | 10/1989 | Matthes | 363/58 X |
| 4,967,109 | 10/1990 | Steigerwald | 307/571 X |
| 5,010,261 | 4/1991 | Steigerwald | 307/571 |
| 5,027,264 | 6/1991 | DeDoncker et al. | 363/16 |

*Primary Examiner*—Steven L. Stephan
*Assistant Examiner*—Emanuel Todd Voeltz
*Attorney, Agent, or Firm*—W. G. Sutcliff

[57] ABSTRACT

A high power, high frequency inverter has series/parallel resonant inverter elements and employs MOS controlled thyristors (MCTs) in the switching circuit. The resonant inverter elements include a split inductor for reducing peak voltage across the switches. A fault protection circuit cause the power interruption for a short interval before restarting the circuit. High current density is achieved by means of multilayer ceramic chip capacitors and gap ferrite planar inductors.

25 Claims, 7 Drawing Sheets

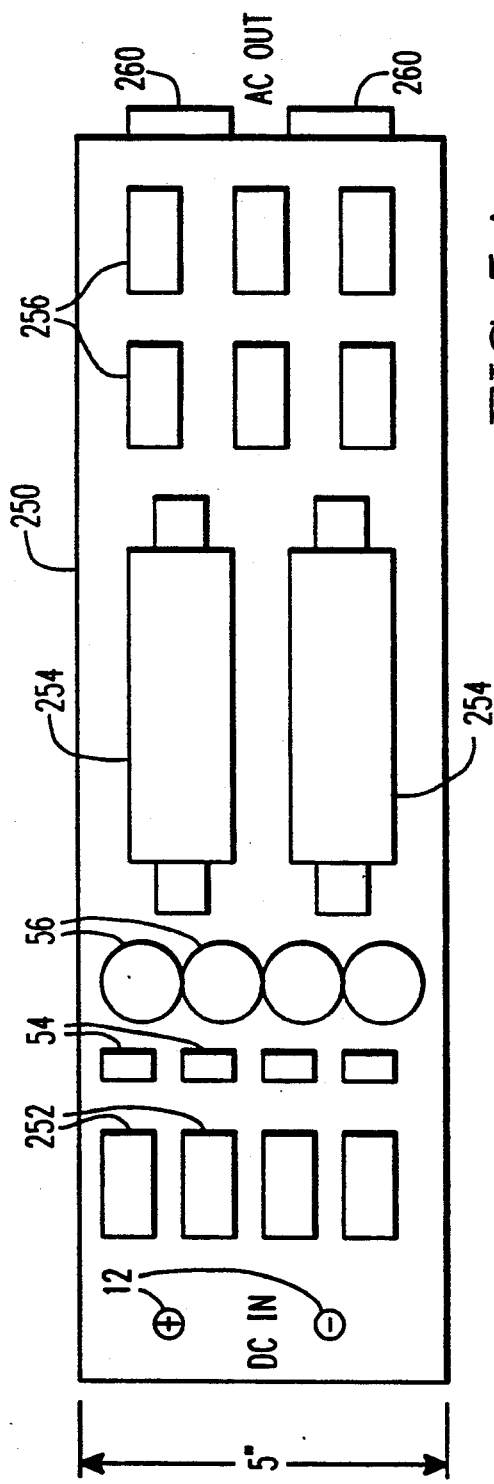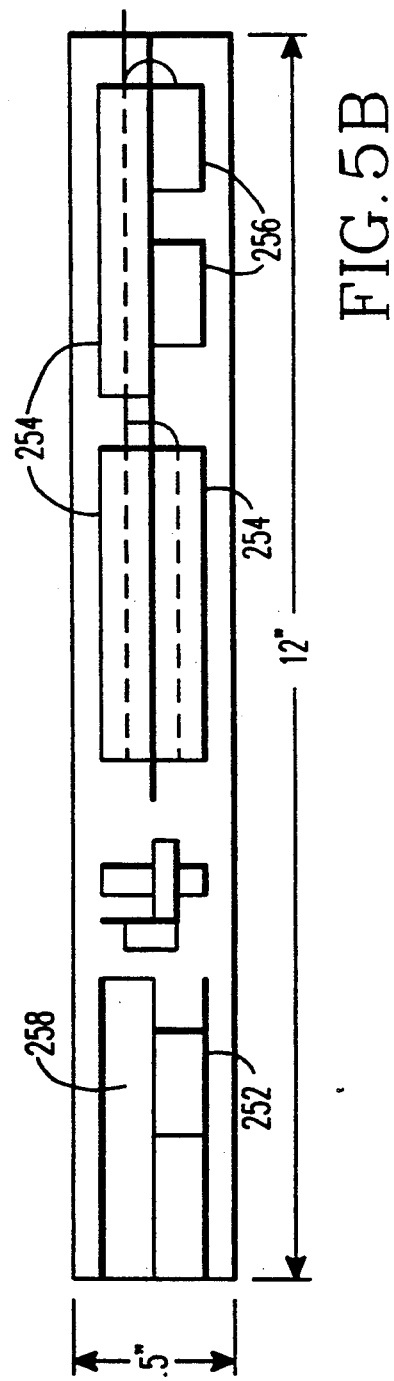
FIG.5A
FIG.5B

HIGH POWER, HIGH FREQUENCY RESONANT INVERTER USING MOS CONTROLLED THYRISTORS

BACKGROUND OF THE INVENTION

1. Field of the Invention:

The invention relates to inverter circuits and in particular to high power, high frequency resonant inverter circuits of reduced size especially useful in airborne systems.

2. Description of the Prior Art:

It is desirable to reduce the size of power converters used as power supplies for modern electronic systems. In general, although progress has been made in increasing power densities and therefore reducing size, the degree of miniaturization of power converters has been much slower than for electronic systems.

Among the major problems associated with building a high power density supply are power dissipation, noise generation and control. It has been found that an increase in the frequency of power conversion allows for a reduction of the size of power supplies. However, power dissipation results from increased switching conduction eddy current and drive losses associated with high frequency operation. Noise generation becomes more severe as parasitic conductances and capacitance become more significant at the higher operating frequencies. Further the high frequency designs are also more sensitive to device operation parameters. The miniaturized size limits volume available for energy storage and thereby excludes some traditional linear control methods. Downsizing also results in smaller thermal area available for heat removal.

Some recent developments in converters employing resonant or quasi-resonant components have attempted to address problems associated with power dissipation and noise generation. In particular, the effects of the parasitic elements have been incorporated into the design making use of them as resonant elements, although of lower quality than desired. As a result, switching losses and noise generation can be somewhat reduced by limiting the rise times of switching waveforms. Control of these quasi-resonant devices, however, is difficult under severe load transients which are to be expected.

A particular series/parallel resonant topology has been employed in high power inverters which use silicon control rectifiers (SCRs) as switches. Operation frequencies have generally been limited to below 20 KHz by the SCR recovery time of about 10 microseconds. Further SCRs have a relatively low maximum operational temperature which has restricted SCR resonant inverters to relatively large surface based applications.

In airborne systems, were size restrictions are more stringent, square wave converters are often used. These devices operate at higher frequencies, lower peak currents and higher temperatures due to the use of transistors for example instead of thyristors. The systems also generally do not use resonant components and are thus reduced in size. Square wave converters have disadvantages including higher switching losses, increased electromagnetic interference caused by sharp switching transitions, shoot-through or short circuit vulnerability and complicated control characteristics.

SUMMARY OF THE INVENTION

The present invention seeks to obviate the disadvantages and limitations of the described prior arrangements. In particular, the present invention comprises a series/parallel resonant inverter which employs MOS controlled thyristors (MCTs) capable of high power, high voltage operation and improved power density. Other improvements include the use of split resonant, ferrite inductors and multilayer ceramic chip capacitors to enhance power density. A fault protection circuit for quickly detecting latch up conditions and interrupting power is also provided.

In a preferred embodiment, the invention comprises an inverter operable at a power of about 10 KW and 100 KHz from a two sided DC source of about 270 volts. A split series/parallel resonant circuit is coupled across the DC line and is operable when energized for producing a sinusoidal output voltage at twice the DC source voltage. The resonant circuit includes a two sided common reactive output leg and two pairs of reactive input legs one of each pair serially coupled diagonally between one side of the output leg and a corresponding side of the DC line. Switching means switchably connects each of the input legs to the corresponding side of the DC line in alternate diagonal pairs serially through the common output leg for energizing resonant circuit element. The switching means includes an MCT for each input leg. A gating circuit coupled to the MCT normally maintains each in a nonconductive state and alternately gates diagonal pairs of the MCTs momentarily only during a positive half cycle of the sinusoidal output. The MCT is rendered nonconductive within about a microsecond of the onset of the negative half cycle of the output.

Other particular features of the invention are specifically described in the specification, drawings and claims.

BRIEF DESCRIPTION OF THE DRAWINGS

FIGS. 5A and 5B are respective side and top illustrations of the layout for the resonant inverter circuit illustrated in FIG. 1.

DESCRIPTION OF THE PREFERRED EMBODIMENT

Figure 1:
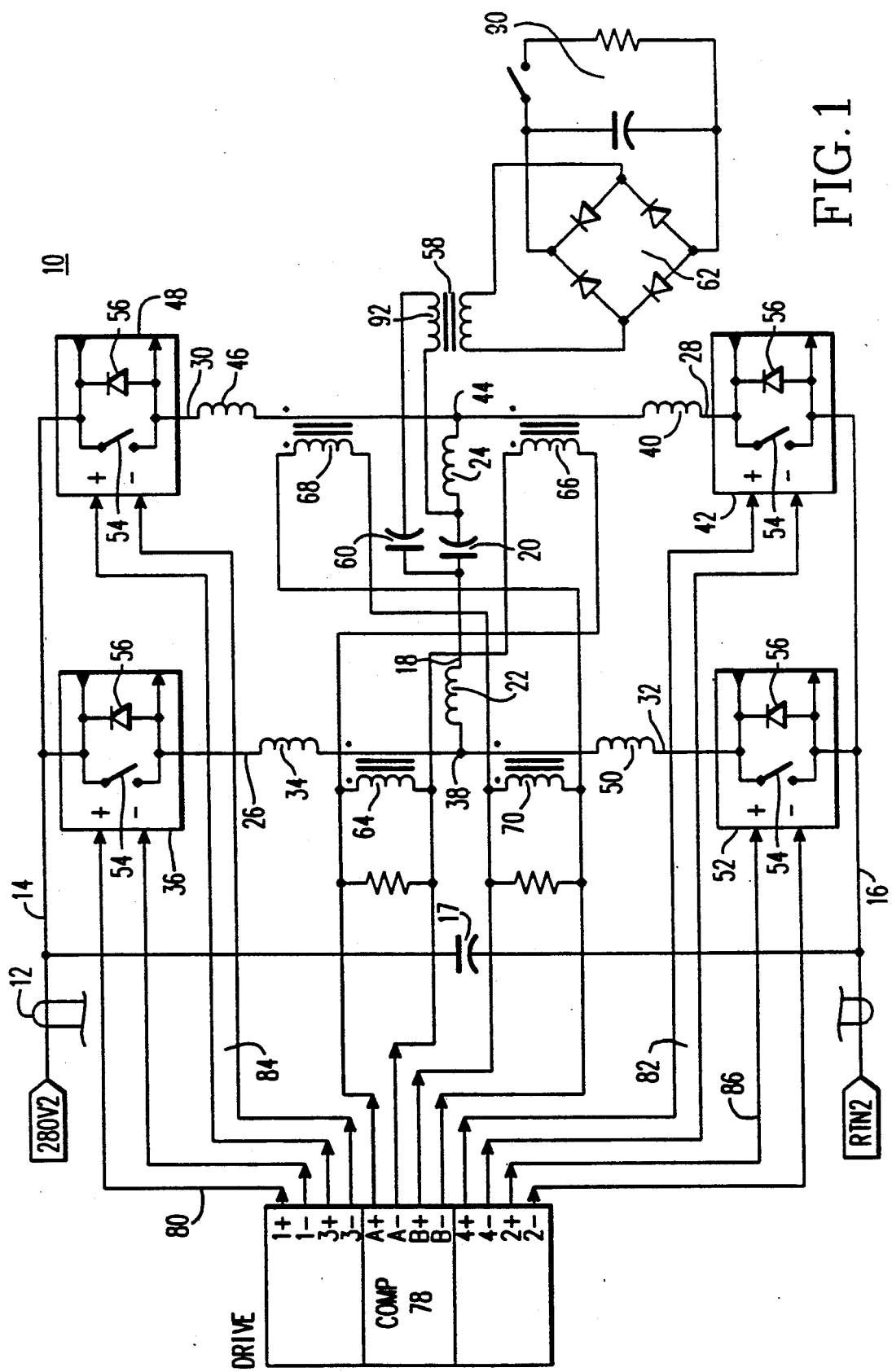
FIG. 1 is a schematic illustration of a series/ parallel resonant inverter circuit according to the present invention.

FIG. 1 illustrates the topology of a resonant inverter 10 according to the present invention. A DC source (not shown supplies DC line 12 having opposite sides 14 and 16. In the preferred embodiment the voltage is derived from full wave rectification of 120/208 voltage AC power resulting in a potential of 280 voltage DC across sides 14 and 16. Filter capacitor 17 coupled across the DC line 12 suppresses transients.

The circuit 10 includes an output leg 18 including an output capacitor 20 and inductors 22 and 24 which are serially connected to opposite sides of the capacitor 20 as shown. Four input legs 26-32 are connected in diagonal pairs 26-28 and 30-32 across the DC line 12 and serially with the common output leg 18 as shown. The input leg 26 includes an inductor 34 and a series connected switch 36 coupled between one side 38 of the output circuit 18 and one side 14 of the DC line 12. Similarly, output leg 28 includes series connected inductor 40 and switch 42 coupled between the other side 44 of the output circuit 18 and side 16 of the DC line 12. Input leg 30 includes inductor 46 and switch 48 coupled between side 44 of the output circuit 18 and line 14 as shown. Likewise, output circuit 32 includes inductor 50 and switch 52 serially connected between side 38 of the output circuit 18 and the line 16 as shown. Each switch 36, 42, 48 and 52 includes a switchable element 54 and a reverse biased diode 56 coupled across the switch element 54 as shown. A step up output transformer 58 and series coupling capacitor 60 are coupled across the output capacitor 20. The transformer 58 is coupled to a full wave bridge rectifier 62 which in a preferred embodiment operates at about 10,000 volts DC. In a preferred embodiment inductors 22-24, 34-40 and 46-50 at each 0.3 $\mu$H; capacitor 20 is 0.25 $\mu$F; and capacitor 60 is 0.5 $\mu$F.

Resistively loaded current sense transformer pairs 64-66 and 68-70 are coupled in an antiparallel configuration in each of the respective legs 26, 28, 30 and 32. That is, transformer 64 in input leg 26 is coupled and antiparallel with transformer 66 in diagonally paired input leg 28. Likewise, current sense transformer 68 in input leg 30 is coupled and antiparallel relation with transformer 70 in diagonally paired input leg 32 as illustrated. Outputs of each of the antiparallel connected current sense transformers 64-66 and 68-70 are coupled to a comparator 78 as illustrated.

Normally, when current flows in alternate diagonal legs, the net current sensed by paired transformers 64-66 is zero and likewise the current sensed by paired transformers 68-70 is zero. If current flows between switches on the same side of the output leg 18, e.g. switches 36 and 52, a net current is sensed by transformer 70 thereby producing a sensible signal with respect to transformer 64. The sensible signal is directed by comparator 78 which produces a disabling output for opening the DC line.

Each of the switches 36, 42, 48 and 52 are operatively coupled to a corresponding drive circuit 79 (FIG. 3) by oppositely poled gate leads 80, 82, 84 and 86 respectively. In a preferred embodiment the switches 36, 42, 48 and 52 are normally in an open or nonconducting condition. In accordance with the preferred timing arrangement of the invention, the drive circuits 79 momentarily activate one diagonal pair of switches, e.g. 36-42, causing a switch current to flow in one direction through the input legs 26-28 and the interconnected output circuit 18. When the circuit is next activated the other diagonal pair of switches 48-52 conduct causing currency to flow in the opposite direction in legs 30-32 and output circuit 180. The combination of inductive elements 34, 22, 24 and 40 and the capacitor 20 produce a sinusoidal output across the capacitor 20 which is sensed by the output transformer 58 and boosted to a high voltage. Likewise, the combination of inductors 46, 50, 20 and 24 and capacitor 20 produce a sinusoidal voltage when energized. In accordance with resonant inverter theory, the sinusoidal voltages sensed by the output transformer 58 operate at about one half the frequency of the switch current and each is, when operating into an open circuit, approximately twice the voltage across the DC line 12 or about 560 volts.

Figure 7A:
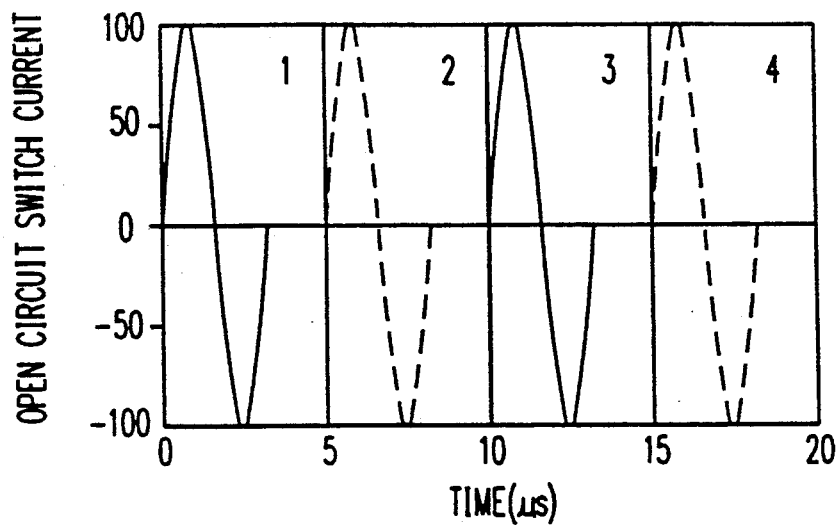
FIG. 7A-7D are illustrations of waveforms used in explaining the operation of various circuits employed in the present invention.
Figure 7B:
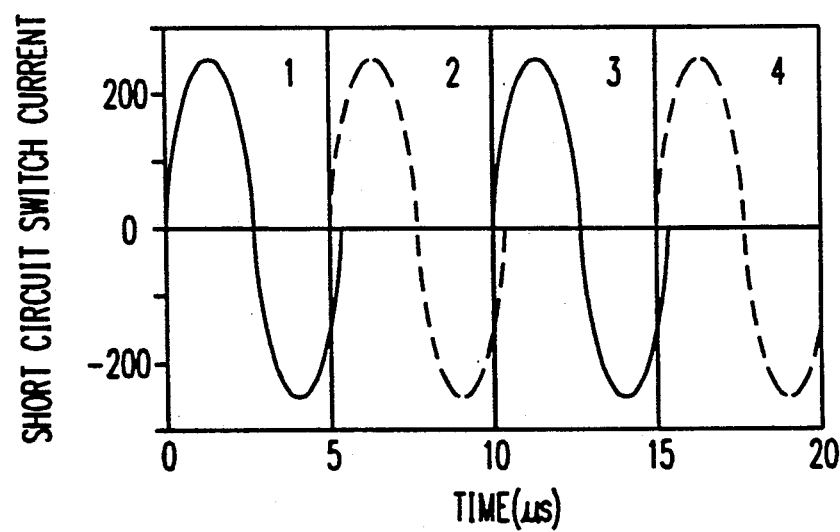

In FIG. 7A the solid lines in quadrants 1 and 3 illustrate graphically the exemplary switch current through a resonant inductor with diagonally paired switches 36 and 42 closed and with an open circuit at the rectified output terminals 90. The dotted lines in quadrants 2 and 4 represent the switch currents with diagonally paired switches 48 and 52 closed. In FIG. 7B the solid lines illustrate graphically the exemplary switch current through a resonant inductor with switches 36 and 42 closed and with a short circuit at the rectified output 90. The dotted lines represent the switch currents with switches 48 and 52 closed. The difference is significant in two ways. The open circuit switch current (FIG. 7A) is about a microsecond shorter and the short circuit current (FIG. 7B) and the amplitude of the short current is about 2½ times that of the open circuit current.

Figure 7C:
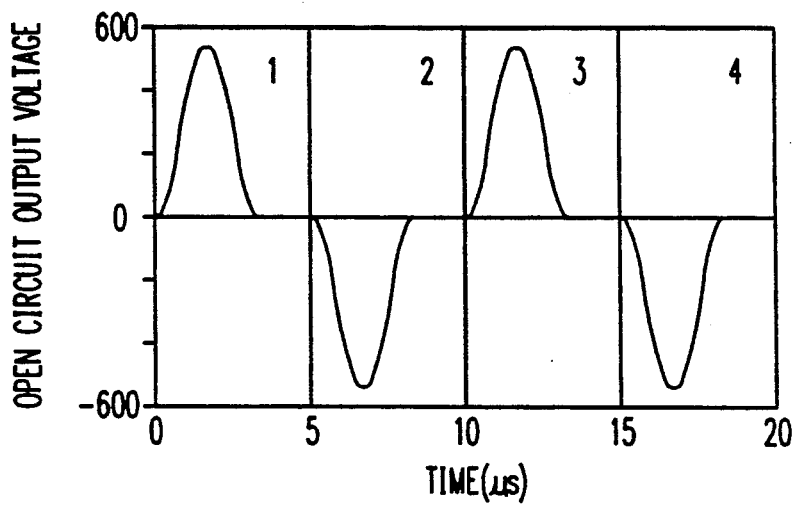

The output voltage of the inverter 10 appears across the input terminals 92 of the transformer and has an exemplary waveform illustrated graphically in FIG. 7C. The positive going pulses alternately occur when the switches 36 and 42 conduct during the positive half cycle of the switch current and charge capacitor 20. In the time between, the opposite pair switches 48 and 52 are gated on charging capacitor 20 in the opposite sense or polarity.

The switch current produced as a result of the activation or closure of the diagonal pairs of switches 36 and 42 causes charge to be built up on the output capacitor 20. The switch elements 54 in the switches 36 and 42 become open circuit upon the onset of the negative half cycle of the output voltage, whereupon the current flows through the reverse biased diodes 56 to complete the circuit. When the other diagonal pair of switches 48 and 52 are thereafter activated the output capacitor 20 is charged to the opposite polarity thereby providing the negative pulse to the output as illustrated in FIG. 7C. The diodes 56 likewise handle the negative half cycle of the switch current. The frequency of the switch current is twice the frequency of the output voltage.

Discontinuity between the positive and negative going output voltage (FIG. 7C) is due to the off time between the conductor periods of switch pairs 36-42 and 48-52. The inverter may be gated on at any frequency up to the maximum operating frequency which approaches the natural resonant frequency of the system. Regulation is achieved by control of the inverter timing, for example by frequency modulation or discreet time control, an example of which is described hereinafter.

The arrangement illustrated in FIG. 1 offers a high degree of flexibility in an inverter design. For example by selecting the ratio of the output and coupling capacitors 20 and 60, open and short circuit current can be controlled. The short circuit current is limited by the series coupling capacitor 60. Output capacitor 20, parallel to the transformer 58, limits the open circuit voltage and the variation of the resonant frequency. The output capacitor 20 also guarantees self-commutation under varying load conditions. In a preferred embodiment, the ratio of the capacitance of the coupling capacitor to the output capacitor is two to one which allows an optimum combination of frequency variation, efficiency and load response.

The inductor current with a short circuit across the rectified output of the transformer 58 illustrated in FIG. 7B, shows that the reverse current (curves 2 and 4) of the diagonal pair 36-42 overlaps the forward current (curves 1 and 3) of the opposite pair switches 48-52. This is permissible provided that the time from the end of the forward current of the first pair and the beginning of the forward current of the second pair does not exceed the recovery time of the switches 36, 42, 48 and 52 which is about one microsecond.

Figure 2:
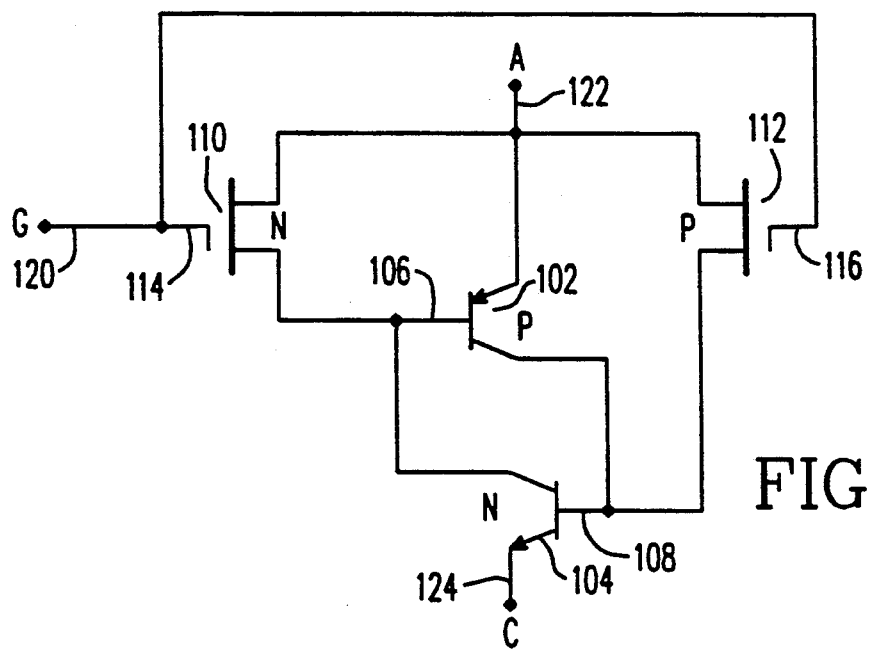
FIG. 2 is a schematic illustration of an equivalent circuit for an MCT switching element employed in the circuit of FIG. 1.

In accordance with the present invention, the switching devices 54 employed in the switches 36, 42, 48 and 52 are MOS controlled thyristors (MCTs). The MCTs 54 have high current capacity, a low forward voltage drop and fast switching times. An equivalent circuit for an MCT employed in the present invention is illustrated in FIG. 2.

The 54 consists of thousands of individual thyristor cells interconnected with MOS control cells. The devices include n-type channel cells and p-type channel cells. The MCT switching element 58 comprises interconnected p-and n-type thyristors 102 and 104. Accordingly, negative bias on the gate 106 of the p-type thyristor 102 causes it to conduct. Likewise, a positive bias on the gate 108 of the n-type thyristor 104 causes it to conduct. Control for the MCT 58 is achieved by means of a pair of n- and p-type FETs 110 and 112. The respective gate electrodes 114 and 116 of the FETs 110 and 112 are tied together to common gate 120 as illustrated. A negative signal on the gate 116 causes the p-type FET 112 to conduct and causes the n-type FET 110 to be biased off. When FET 112 conducts a positive voltage from anode 117 is applied to gate 108 of thyristor 104 causing it to conduct, thereby pulling gate 106 of thyristor 102 negative causing it to conduct, whereupon the MCT switching element 58 is turned ON and conducts between the anode 122 and cathode 124. At the same time the negative bias on gate 116 being tied to gate 114 of p-type FET 110 causes it to be open circuit. During the positive half cycle of the switch current the MCT 58 conducts. Upon initiation of the negative half cycle, however, the thyristor 104 ceases to conduct which thereby drives thyristor 102 open circuit and the MCT 58 switch becomes nonconductive. In order to assure that the MCT 58 does not become inadvertently conductive, the gate 114 of n-type FET 110 is biased positively causing it to conduct and thereby short the gate 106 of thyristor 102 holding it off. It can be seen that the MCT switch 58 is desirably only turned on during the positive half cycle of the switch current and when the FET 112 is biased on. Commutation at or near the zero crossover is nonstressful to the inverter components and results in high reliability and low power dissipation.

Figure 3:
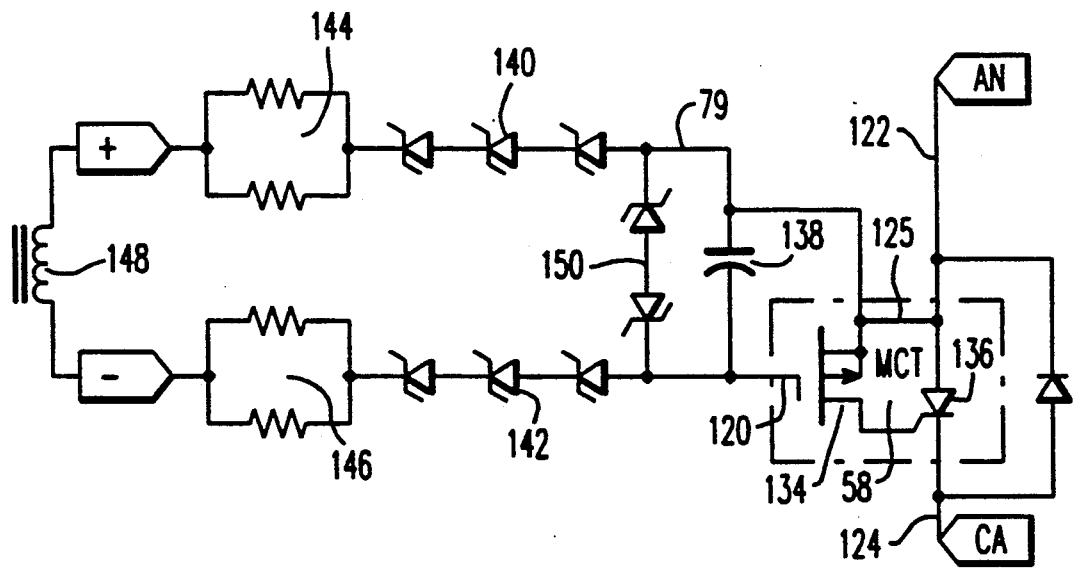
FIG. 3 is a schematic diagram of a gate drive circuit for operating the MCT switching element illustrated in FIG. 2.

FIG. 3 illustrates a preferred gate drive 79 for the inverter of the present invention. For simplicity a single FET 137 and thyristor 136 schematically illustrates the principle of operation. The capacitor 138 is coupled by jumper 125 between anode 122 and the gate 120. When the anode 122 is positive with respect to gate 120 the FET 134 conducts causing the thyristor 136 to be gated on. When the anode 122 is negative with respect to the gate 120 the FET 134 is off and the thyristor 136 is open circuit. Gate circuit 79 includes opposed sets of zener diodes 140 and 142 in series with limiting resistors 144 and 146. An input transformer 148 is coupled between the limiting resistors 144 and 146 as shown. Back to back zener diodes 150 coupled across the capacitor 138 prevent an over voltage condition on MCT 58 by clamping the capacitor voltage between the anode 122 and the gate 120 to their breakdown voltages. A positive signal on the transformer 148 overcomes the reverse bias of zener diodes 140 and charges the capacitor 138 so that the anode 122 is positive with respect to the cathode 120 thereby allowing switching element 58 to conduct. The charge is maintained on the capacitor 138 as a result of the reverse bias on the oppositely poled zener diodes 142. When the polarity of the input signal on the transformer 148 is reversed, the capacitor 138 charges in the opposite sense so that the anode 122 is negative with respect to the gate 120 causing the switching element 58 to be cut off. Charge is maintained on the capacitor 138 as a result of the reverse bias on the zener diodes 140. Thus, the gate drive 79 circuit shown in FIG. 3 maintains its last activated state for positive control of the switching device 58.

Figure 4:
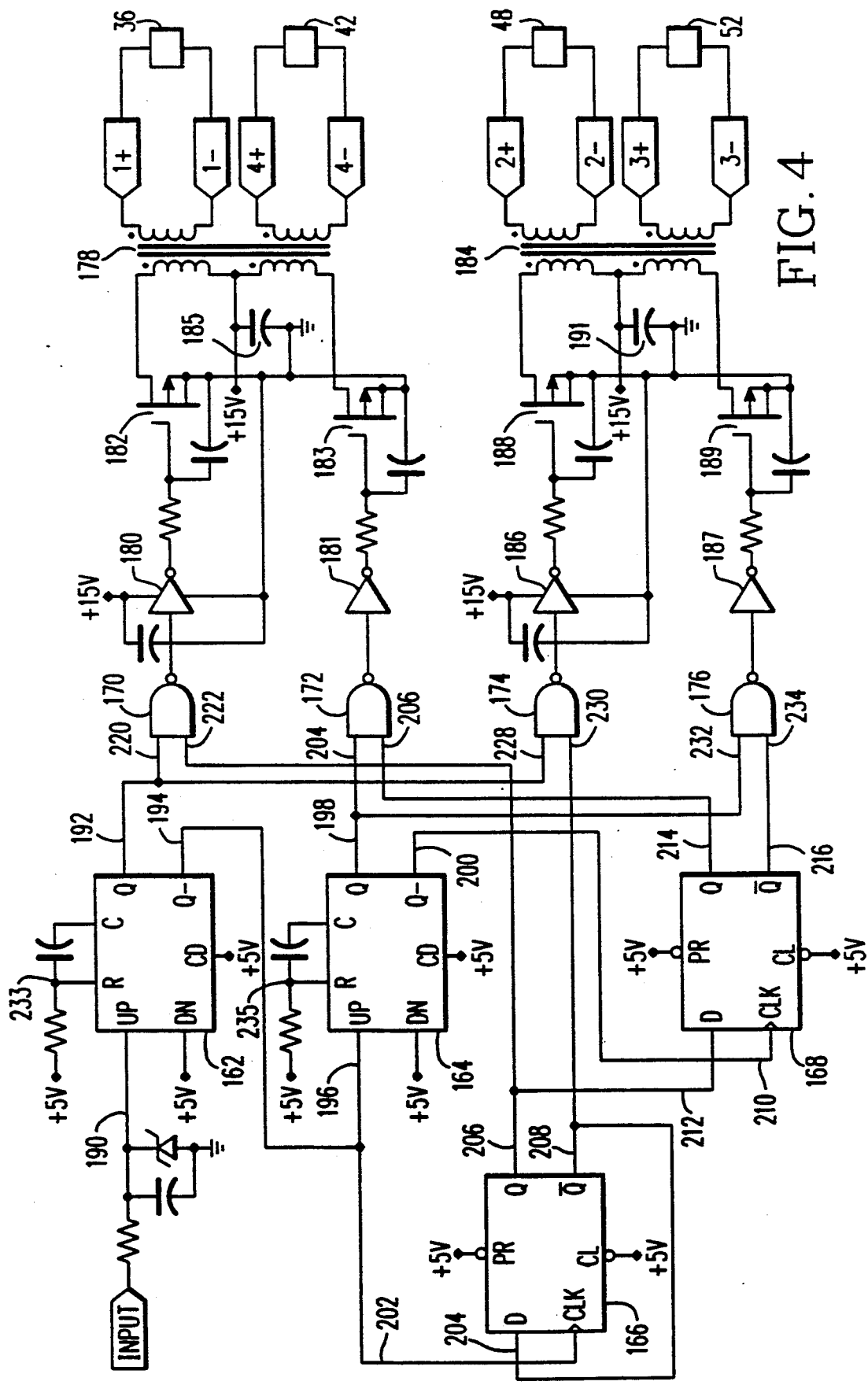
FIG. 4 is a schematic block diagram of a control circuit alternately gating diagonal pairs of switches in the circuit of FIG. 1.

An inverter control circuit 160 is illustrated in FIG. 4. The circuit includes a pair of ON and OFF one shot circuits 162 and 164 and a pair of steering D flip-flops 166 and 168. AND gates 170-172 and 174-176 are grouped in pairs. AND gates 170-172 drive opposite sides of push/pull transformer 178 through a drive circuit including respective amplifiers 180-181 and FET switches 182-183. AND gates 174 and 176 drive opposite sides of push/pull transformer 184 via the drive circuit including respective amplifiers 186-187 and FETs 188-189. The secondary side of the push/pull amplifier 178 is coupled to the input of the diagonal of pair of switches 36 and 42. Likewise, the secondary of the push/pull transformer 184 is coupled to the diagonal of pair switches 48 and 52 as shown. To achieve sequential paired activation of the switches 36-42 and 48-52 only one AND gate 170-176 is ON at any one time.

The ON one shot 162 has input 190, a Q output 192 and a Q bar output 194. The Q output is coupled to AND gates 170 and 174. The OFF one shot 164 has an input 196, a Q output 198 and a Q bar output 200. The Q output is coupled to AND gates 172 and 176. The D flip-flop 166 has a clock input 202, a D input 204, Q output 206 and Q bar output 208 which is fed back to the D input 204. Likewise, D flip-flop 168 has a clock input 210, a D input 212 and respective Q and Q bar outputs 214 and 216.

The Q output 192 of the ON one shot 162 is coupled to one input 220 of AND gate 170. Q output 206 of D flip-flop 166 is coupled to the other input 222 of AND gate 170. When the two inputs are activated a positive going pulse through capacitor 185 is produced in the push/pull transformer 178 for activating switches 36 and 42. The high Q output 206 of D flip-flop also sets D input 212 of D flip-flop 168. The remaining AND gates 172, 174 and 176 are deactivated at this time.

When the ON one shot 162 clocks out it lowers the Q output 192 thereby turning off AND gate 170 and it raises its Q bar output 194. This raises the input 196 to the OFF one shot 164 and drives its Q output 198 high. The Q output 198 of the OFF one shot 164 clocks D flip-flop 168 driving its Q output 214 high in accordance with its high D input 212. At the same time, the Q bar output 194 of ON one shot 162 clocks the D flip-flop 166 causing its Q output 206 to go low in accordance with the low Q bar output 208 which is fed back to the D input 204 as shown. The Q output 198 of the OFF one shot 164 drives one input 204 of the AND gate 172 high. At the same time the high Q output 214 of the D flip-flop 168 drives the other input 206 of AND gate 172 high which causes it to drive the push/pull transformer 178 in the opposite direction through the capacitor 185 to produce a negative signal which turns OFF the switches 36 and 42.

On the next clock pulse, the Q output 192 of the ON one shot 162 activates input 228 of AND gate 174 and the Q bar output 208 of the D flip-flop 166 goes high and activates the other input 230 of AND gate 174 causing the push/pull transformer 184 to produce a positive going pulse through the capacitor 191 turning on switches 48 and 52. On the next pulse Q output 198 of OFF one shot 164 drives input 232 of AND gate 176 high while the Q bar output of D flip-flop 168 drives the other input 234 high causing a negative going pulse through the push/pull transformer 184 turning off switches 48 and 52. The AND gates 170 and 174 share the Q output 192 of the ON one shot 162. The AND gates 172 and 176 share the Q output 198 of the OFF one shot 164. The D flip-flop 166 drives AND gate 170 and D flip-flop 168 drives AND gate 174. However, because D flip-flops are inversely connected, as described, ON gates 170 and 174 cannot be ON at the same time. The OFF gates 172 and 176 are connected to achieve a likewise result. In this way, the paired AND gates 170–172 and 174–176 are turned on in sequence for activating diagonal pairs of switches 36, 42, 48 and 52 in the inverter circuit 10 of FIG. 1.

In a preferred embodiment, at 100 KHz the on time of the switches 36, 42, 48 and 52 is about 2½ to 5 microseconds and the off time is about 3 to 6 microseconds. The off time is longer than the on time in order to force the push/pull drive transformers 178 and 182 to reset after each cycle thereby preventing saturation. For 50 KHz operation, the ON time is 5 microseconds and the OFF time is 6 microseconds.

Figure 7D:
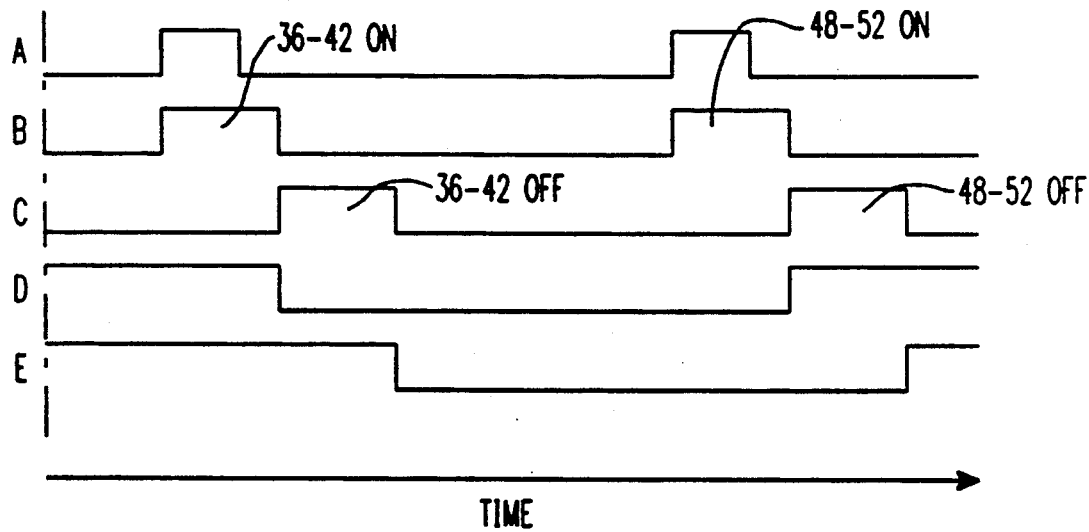

A timing chart is illustrated in FIG. 7D. The pulses of driving input 100 as a function of time are plotted on line A, the Q output of ON one shot 162 is plotted on line B and the Q output OFF the one shot 164 is plotted on line C. The Q output of D flip-flop 166 is plotted on line D and the Q output of flip-flop 168 is plotted on line E. The on and off times are 2.5 microseconds and 3 microseconds respectively for 100 KHz operation. It should be noted that the sequence of the on and off plots on lines B and C allow for sequential operation of paired AND gates 170–172 and 174–176. The plot on line D shows that the D flip-flops 166 and 168 constantly reverse their respective conditions for enabling the paired AND gates 170–172 and 174–176 in sequence. The D flip-flops 166 and 168 remember which set of switches was last sequenced.

The timing of the ON and OFF one shots 162 and 164 is achieved by means of RC networks 233 and 235. In the arrangement, the resistance in each network is trimmed to provide the appropriate time constant for the circuit. In the preferred embodiment, for example, RC network 233 has a resistance of 10K ohm and a capacitor of 1000 PF and RC network 235 has similar rate of 8K ohm and 1000 PF.

The desired layout in respective side and top of the power inverter of the present invention is illustrated in FIGS. 5A and 5B in which a chassis 250 supports the various components in a two sided configuration. In the arrangement, ceramic capacitors and ferrite inductors are employed. A first set of four equal value capacitors 252 corresponding to the filter capacitor 17 in FIG. 1 mounted to the chassis 250 and are coupled across the DC line 12. Switch elements 54 are mounted adjacent the filter capacitors 252 as are the diodes 56. Six equal value inductor elements 254 are mounted to the chassis 250 as shown. Six equal value capacitor elements 256 corresponding to the output and coupling capacitors 20 and 60 are provided. Four of the capacitor elements 256 make up the coupling capacitor 60 and two of the capacitor elements 256 make up the output capacitor 20. A control element 258, incorporating the elements of the control circuit of FIG. 4 is mounted through the chassis 250 opposite the input filter capacitors 252. The six inductor elements 254 correspond to the various resonant inductor elements 22, 24, 34, 40, 46 and 50, which in accordance with the present invention of the same value and accordingly may be constructed in an identical manner in order to simplify the manufacture of the device. AC output leads 260 are provided as a plug-in connection for coupling to the output transformer 58 and the rectifiers 62 which are not contained on the supply chassis 250 illustrated. The chassis 250 may be mounted in thermal contact with a cold plate or heat sink, not illustrated, for effecting heat dissipation.

The chip capacitors 252 and 256 are formed in a known manner from multilayers of metal and ceramic materials, not shown, fired at a high temperature to provide the stable capacitance required for the power supply.

Figure 6A:
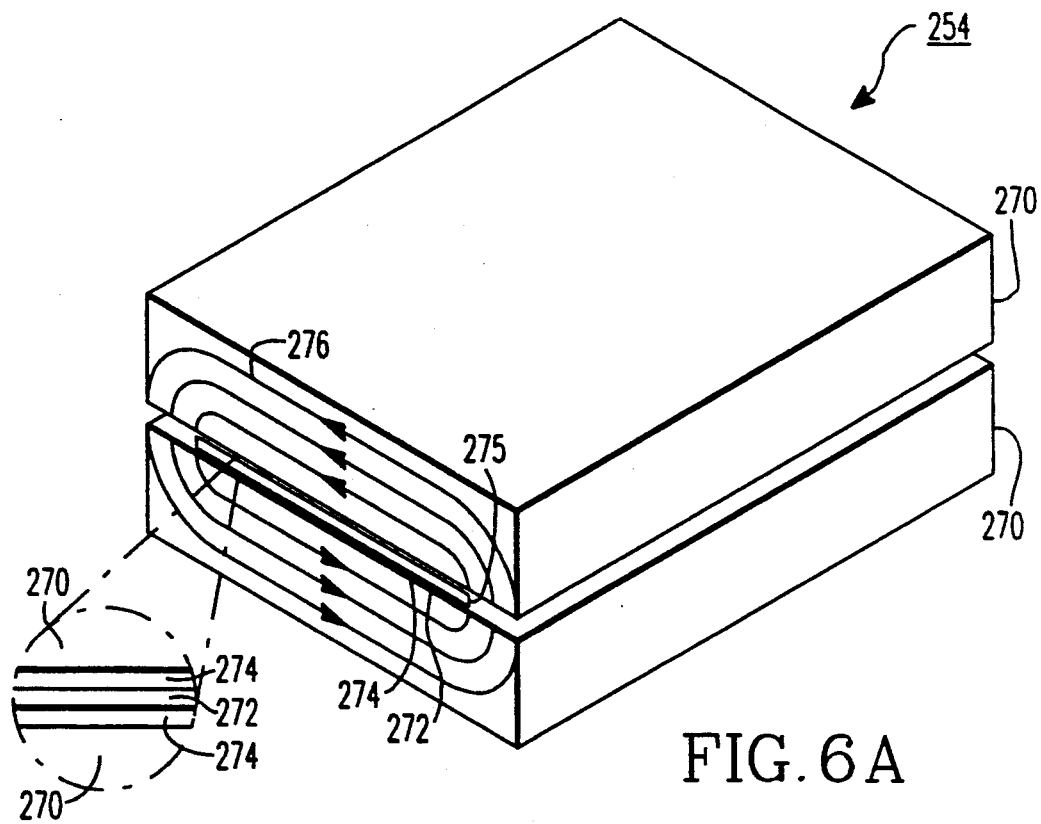
FIG. 6A and 6B are perspective illustrations of exemplary resonant inductor devices employed in the circuit of FIG. 1.

One embodiment of the inductor element 254 is illustrated in FIG. 6A. A pair of planar ferrite members 270 (e.g. MN80 ferrite) are located in confronting relationship, and a copper tape conductor 272 is located between the ferrite members 270. Insulation 274 insulates the inductor 272 and spaces the ferrite members 270 apart. The ferrite members 270 extend beyond the lateral edges 275 of the conductor 272 as shown and current in the conductor establishes the magnetic field 276 which is illustrated by the curved lines. The direction of the field is illustrated by the arrowheads. The inductor 272 is capable of carrying a relatively high frequency high current signal, for example a 200 KHz at 40 amperes. By virtue of the skin effect, a relatively thin, for example 20 mill thick, copper tape has about the same resistance as a circular wire half an inch in diameter. The arrangement of FIG. 6A therefore provides a compact and high current carrying capacity inductor.

Figure 6B:
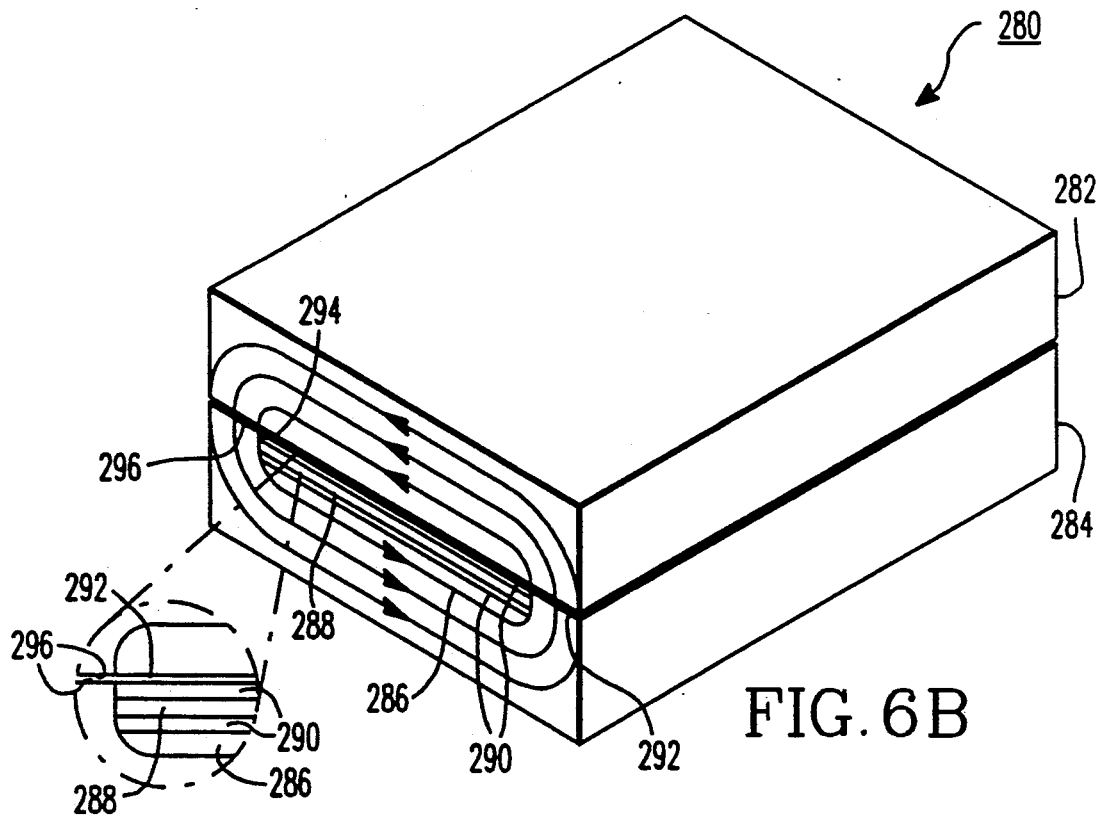

In an alternative embodiment illustrated in FIG. 6B inductor 280 is formed of a first planar ferrite member 282 and a second confronting ferrite member 284 which has a slot 286 for receiving the tape conductor 288 and the insulation layers 290. A spacer 292 extending across the planar ferrite 282 and beyond the marginal edges 294, as shown, accurately spaces the confronting faces 296 of the ferrites 282 and 284 to provide a measured gap therebetween.

There has therefore been provided a full bridge series/parallel resonant inverter capable of operating at a 100 KHz and to provide 10 KW high voltage output from a 270 volt DC input source. The inverter employs MOS controlled thyristors, multilayer ceramic chip capacitors, and planar ferrite inductors to achieve a small volume resulting in an increase in power density of about 10 to 1 over conventional power supplies.

While there has been described what at present are believed to be the preferred embodiments of the present invention, it will be apparent to those skilled in the art

What is claimed is:

1. An inverter operable to power of 10 KW and 100 KHz from a two-sided DC source of about 270 volts comprising:

resonant circuit means operable when energized for producing a sinusoidal output voltage at twice the DC source voltage including; a common reactive output leg having opposite ends;

at least two pair of reactive input legs, each pair being switchably coupled in series diagonally through opposite ends of the output leg to opposite sides of the DC line;

switch means in series with each input leg for switchably connecting the diagonal pairs of input legs alternately to the DC source for energizing the resonant circuit means, said switch means including a MOS controlled thyristor (MCT) for each input leg having an anode, a cathode and a gate for serially connecting each input leg through the anode and cathode to the DC source when in a conducting state and for opening the leg when in a nonconducting state;

gating means coupled to the gate of each MCT for normally maintaining each MCT off to a nonconducting state and for alternately gating one diagonal pair of the MCTs momentarily on only during the positive half cycle of the sinusoidal output, said pair of MCTs being rendered nonconductive within about 1 microsecond of the onset of the negative half cycle thereof for preventing a short circuit during any period of overlap during which the MCTs in more than one pair of input legs are on.

2. The inverter of claim 1 wherein the resonant circuit means comprises split series/parallel inductor means including an inductor in each input leg and a pair of inductors and a capacitor in series therebetween in the output leg.

3. The inverter of claim 2 wherein the inductor means comprise a pair of planar ferrite member sin confronting space relation and a planar conductor located in the space between the ferrite members.

4. The inverter of claim 3 wherein at least one of the ferrite members has a slot for receiving the conductor.

5. The inverter of claim 3 further comprising spacer means located between he ferrite members for establishing a gap therebetween.

6. The inverter of claim 3 further comprising an insulator surrounding the conductor for insulating it from the ferrite members.

7. The inverter of claim 2 wherein the capacitor comprises ceramic chip capacitors.

8. The inverter of claim 1 further comprising an output circuit including a resonant reactive circuit in parallel with the capacitor.

9. The inverter of claim 2 wherein the resonant circuit means includes an output transformer and a series coupling capacitor in parallel with the output leg.

10. The inverter f claim 9 further comprising an output full wave bridge circuit coupled to the output transformer.

11. The inverter of claim 8 wherein the coupling capacitor is sized about twice that of the capacitor in the output leg.

12. The inverter of claim 1 further comprising sensing means in each input leg for sensing current flow therein and means responsively coupled between the sensing means and the gating means for producing an overriding gating signal when current is sensed in the input legs coupled to the same side of the output leg.

13. The inverter of claim 12 wherein sensing means includes a sensing transformer in each input leg.

14. The inverter of claim 13 wherein the sensing transformers in alternate legs are coupled together in antiparallel relation.

15. The inverter of claim 13 wherein the means for producing an overriding signal comprises a comparator responsive to the sensing transformer coupled to the same side of the output leg.

16. The inverter of claim 1 wherein the switch means includes a reverse biased diode in shunt with the MCT.

17. The inverter of claim 1 wherein the gating means comprises polarized energy storage means for alternately providing a positive and negative gate voltage at the MCT.

18. The inverter of claim 17 wherein the polarized energy storage means includes the capacitor coupled across the MCT and a pair of reverse biased back to back zener diodes in parallel with the capacitor.

19. The inverter of claim 17 wherein the gating means comprises logic means coupled to the MCT in each input leg.

20. The inverter of claim 19 wherein the logic means comprises an ON one shot for rendering conductive diagonal pairs of said MCT and an OFF one shot for rendering said diagonal pairs nonconductive.

21. The inverter of claim 20 further including timing means for rendering the diagonal pairs of MCTs ON for a first internal and for rendering the MCTs OFF for a longer interval shorter than the first interval.

22. The inverter of claim 20 wherein the logic means further comprises a pair of inversely coupled D flip-flops one each respectively responsive to the ON and OFF one shots for providing alternate outputs.

23. The inverter of claim 22 wherein the logic means further comprises AND gate means responsive to the ON and OFF one shots and the D flip-flops for sequentially rendering one pair of switch means at a time conductive and thereafter nonconductive in accordance with the alternate outputs of the D flip-flops.

24. An inverter operable to power of 10 KW and 100 KHz from a two-sided DC source of about 270 bolts comprising:

split series/parallel resonant circuit means operable when energized for producing a sinusoidal output voltage at twice the DC source voltage including; a two sided common reactive output leg having opposite ends;

at least two pair of reactive input legs, each pair being switchably coupled in series diagonally through the opposite ends of the output leg to opposite sides of the DC line;

switch means for switchably connecting the diagonal paris of input legs alternately to the DC source for energizing the resonant circuit means, said switch means for serially connecting each input leg to the DC source when in a conducting state and for opening the leg when in a nonconducting state;

gating means normally maintaining the switch means off and alternately gating the switch means for energizing diagonal pairs of legs serially through the output circuit, said switch means being rendered nonconductive within about 1 microsecond of the onset of the negative half cycle of the sinusoidal output.

25. A high power inverter comprising:

split series/parallel resonant circuit means operable when energized for producing a sinusoidal output voltage at twice the DC source voltage including;

a common reactive output leg having opposite ends;

at lest two pair of reactive input legs, each pair being switchably coupled in series diagonally through the opposite ends of the output leg to opposite sides of the DC line;

switch means for switchably connecting the diagonal pairs of input legs alternatively to the DC source for energizing the resonant circuit means, said switch means for serially connecting each input leg to the DC source when in a conducting state and for opening the leg when in a nonconducting state;

fixed duration drive circuit means normally maintaining the switch means off and alternately gating the switch means on for energizing diagonal pairs of legs serially through the output circuit, said switch means being rendered nonconductive within about 1 microsecond of the onset of the negative half cycle of the sinusoidal output.

* * * * *